(12) United States Patent
Heider et al.

(10) Patent No.: US 9,947,600 B2
(45) Date of Patent: Apr. 17, 2018

(54) SEMICONDUCTOR STRUCTURE HAVING A TEST STRUCTURE FORMED IN A GROUP III NITRIDE LAYER

(71) Applicant: Infineon Technologies Austria AG, Villach (AT)

(72) Inventors: Franz Heider, Villach (AT); Bernhard Brunner, Feldkirchen (AT); Clemens Ostermaier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/622,109

(22) Filed: Jun. 14, 2017

(65) Prior Publication Data
US 2017/0330808 A1 Nov. 16, 2017

Related U.S. Application Data

(62) Division of application No. 15/150,885, filed on May 10, 2016, now Pat. No. 9,728,470.

(51) Int. Cl.
| | |
|---|---|
| *H01L 21/00* | (2006.01) |
| *H01L 21/66* | (2006.01) |
| *H01L 29/205* | (2006.01) |
| *H01L 29/06* | (2006.01) |
| *G01B 11/30* | (2006.01) |
| *G01B 11/02* | (2006.01) |
| *H01L 21/02* | (2006.01) |
| *H01L 29/778* | (2006.01) |

(Continued)

(52) U.S. Cl.
CPC .............. *H01L 22/20* (2013.01); *G01B 11/02* (2013.01); *G01B 11/303* (2013.01); *H01L 21/0254* (2013.01); *H01L 29/0692* (2013.01); *H01L 29/2003* (2013.01); *H01L 29/205* (2013.01); *H01L 29/66462* (2013.01); *H01L 29/7787* (2013.01)

(58) Field of Classification Search
CPC ................. H01L 22/20; H01L 29/2003; H01L 29/66462
See application file for complete search history.

(56) References Cited

U.S. PATENT DOCUMENTS

| | | | |
|---|---|---|---|
| 5,841,543 A | 11/1998 | Guldi et al. | |
| 5,963,329 A * | 10/1999 | Conrad ................. | G01B 11/02 356/601 |

(Continued)

FOREIGN PATENT DOCUMENTS

| | | |
|---|---|---|
| WO | 03074995 A2 | 9/2003 |
| WO | 2006091913 A1 | 8/2006 |
| WO | 2015175425 A1 | 11/2015 |

*Primary Examiner* — Laura Menz
(74) *Attorney, Agent, or Firm* — Murphy, Bilak & Homiller, PLLC

(57) ABSTRACT

In an embodiment, a semiconductor structure includes a support substrate comprising a surface adapted to support epitaxial growth of a Group III nitride, one or more epitaxial Group III nitride layers arranged on the surface and supporting a plurality of transistor devices assembled upon the support substrate, and a test structure formed in a Group III nitride layer. The test structure includes a plurality of trenches configured to provide an optical diffraction grating when illuminated by UV light. The trenches have a parameter corresponding to a parameter of a feature of the transistor devices.

5 Claims, 7 Drawing Sheets

(51) Int. Cl.
*H01L 29/66* (2006.01)
*H01L 29/20* (2006.01)

(56) References Cited

U.S. PATENT DOCUMENTS

| | | | | |
|---|---|---|---|---|
| 7,212,293 | B1* | 5/2007 | Li | G01B 11/24 356/610 |
| 7,751,046 | B2* | 7/2010 | Levy | G01N 21/211 356/237.1 |
| 7,859,659 | B2* | 12/2010 | Xu | G01B 11/0641 356/300 |
| 9,412,911 | B2* | 8/2016 | Atanackovic | H01L 33/44 |
| 9,728,470 | B1* | 8/2017 | Heider | H01L 22/20 |
| 2002/0093648 | A1* | 7/2002 | Nikoonahad | G01N 21/211 356/237.1 |
| 2002/0177245 | A1 | 11/2002 | Sonderman et al. | |
| 2004/0038139 | A1 | 2/2004 | Mui et al. | |
| 2004/0235205 | A1* | 11/2004 | Levy | G01N 21/211 438/14 |
| 2006/0236923 | A1* | 10/2006 | Kouvetakis | C30B 25/02 117/108 |
| 2007/0089496 | A1* | 4/2007 | Degertekin | B82Y 35/00 73/104 |
| 2015/0014723 | A1* | 1/2015 | Atanackovic | H01L 33/44 257/98 |
| 2015/0192514 | A1 | 7/2015 | Hines et al. | |
| 2016/0308090 | A1* | 10/2016 | Atanackovic | H01L 33/44 |
| 2017/0330808 | A1* | 11/2017 | Heider | H01L 22/20 |

\* cited by examiner

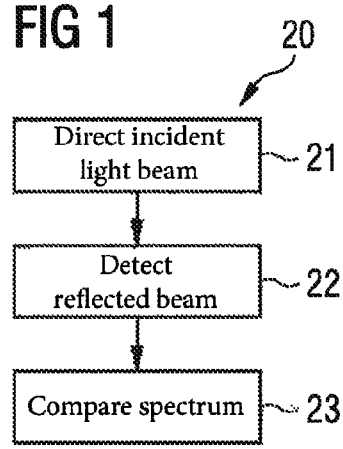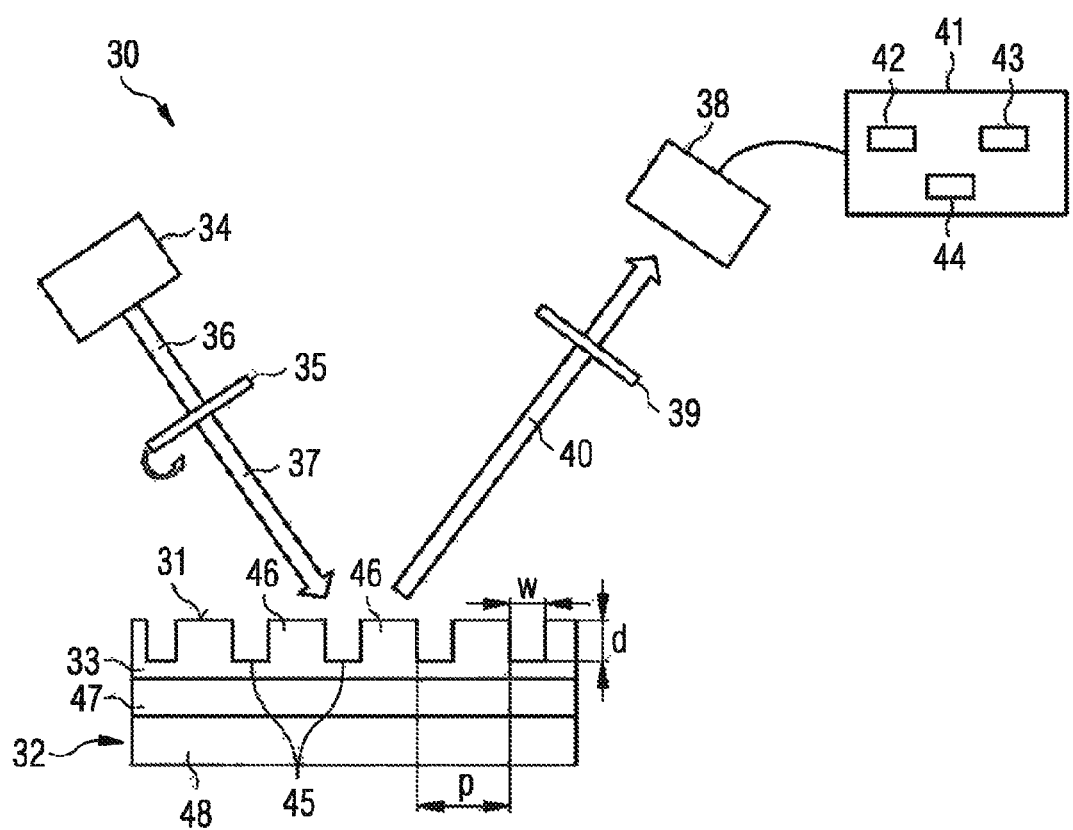

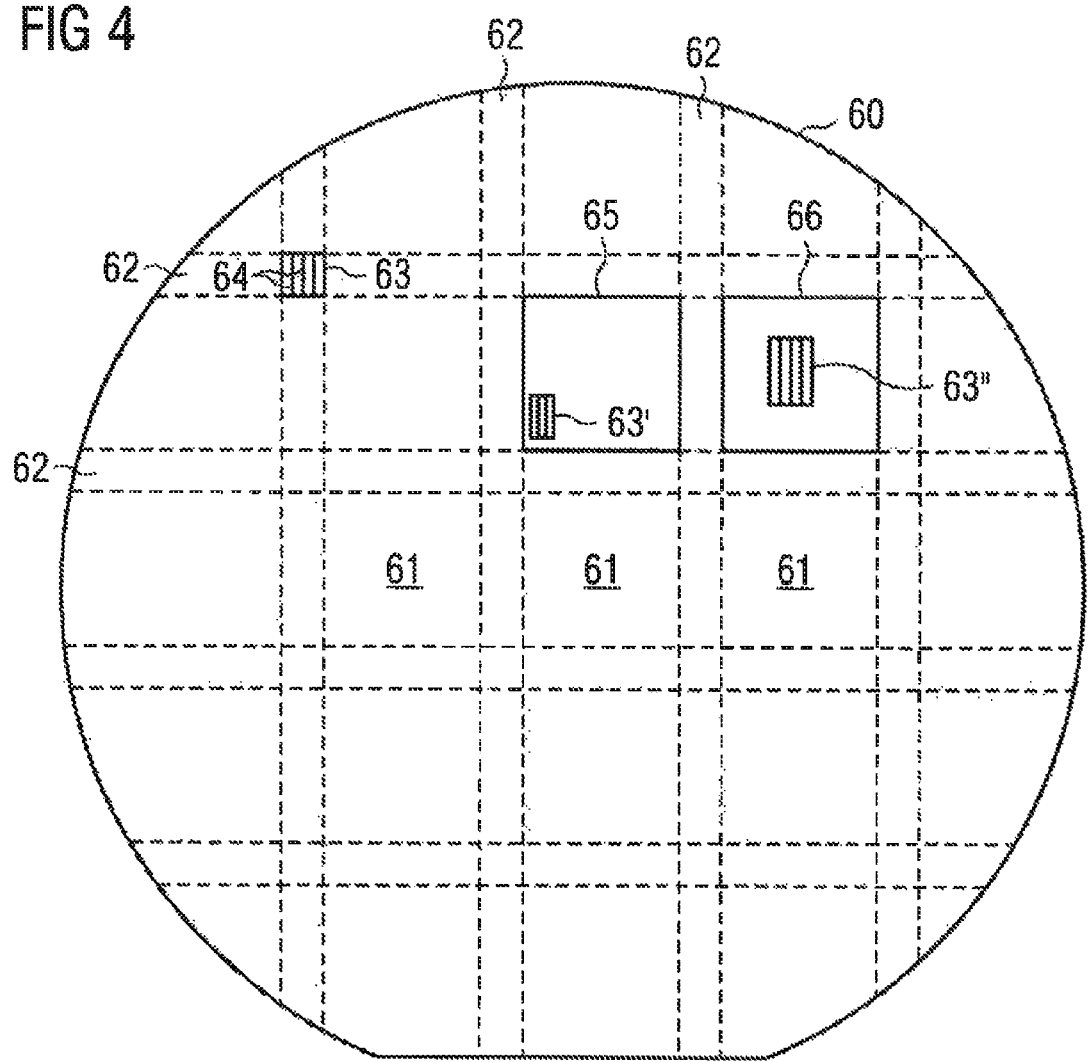

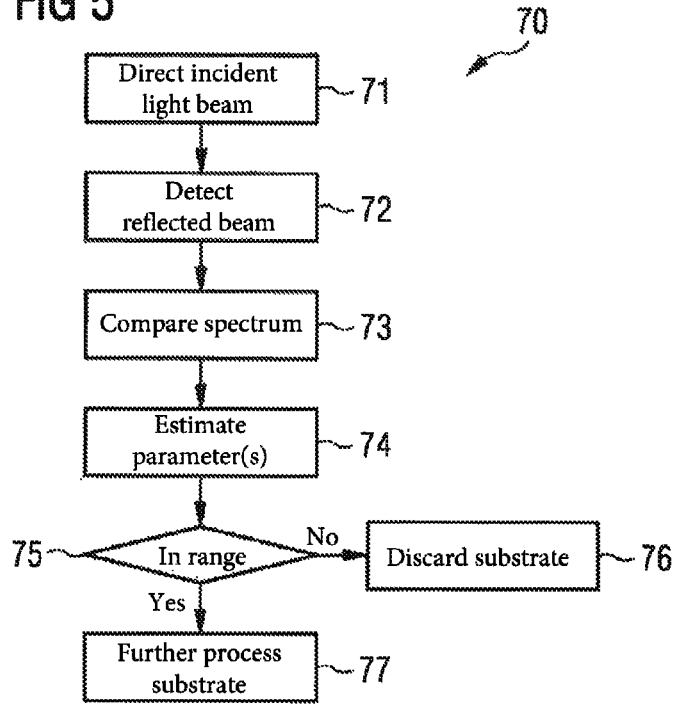
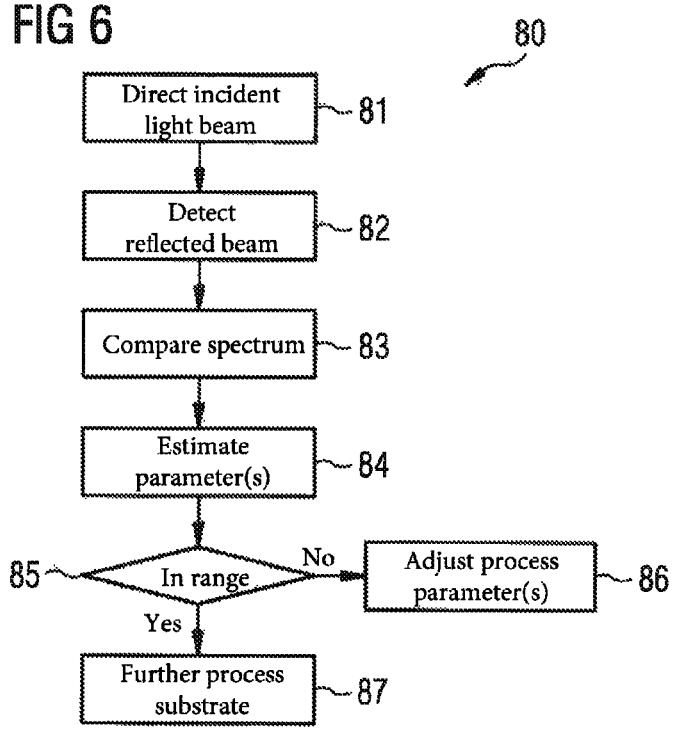

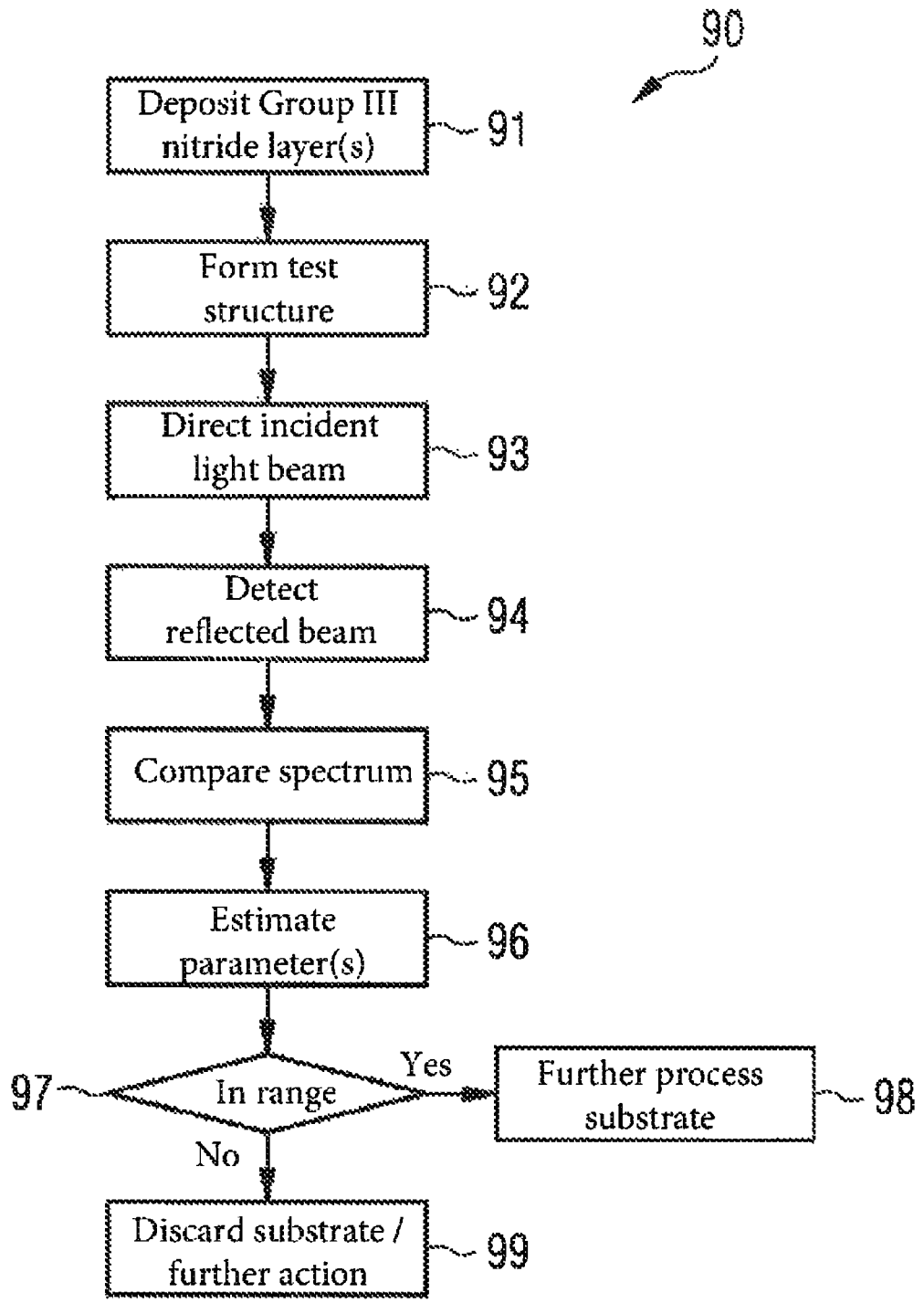

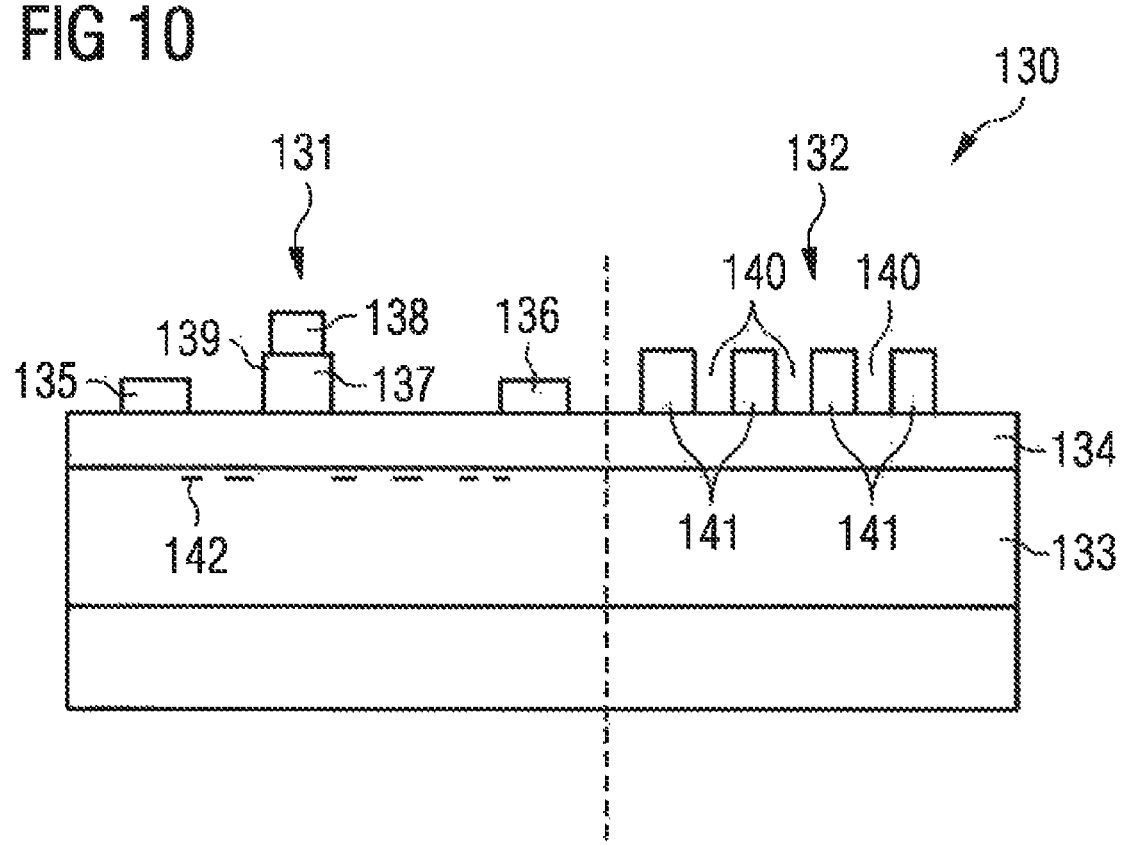

SEMICONDUCTOR STRUCTURE HAVING A TEST STRUCTURE FORMED IN A GROUP III NITRIDE LAYER

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III nitride semiconductor devices, such as gallium nitride (GaN) devices, are now emerging as attractive candidates to carry large currents, support high voltages and to provide very low on-resistance and fast switching times.

Methods for producing Group III-nitride semiconductor devices are desirable.

SUMMARY

In an embodiment, a method for evaluating a surface of a semiconductor substrate includes directing an incident light beam having multiple wavelengths at a position of a layer having a surface profile configured to form an optical diffraction grating, the layer comprising a Group III nitride, detecting a reflected beam, reflected from the position, and obtaining a spectrum of reflected intensity as a function of wavelength, the spectrum being representative of the surface profile of the position of the layer from which the beam is reflected, comparing the spectrum obtained from the detected beam with one or more reference spectra stored in memory, and estimating at least one parameter of the surface profile.

In an embodiment, a semiconductor structure includes a support substrate having a surface adapted to support epitaxial growth of a Group III nitride, one or more epitaxial Group III nitride layers arranged on the surface and supporting a plurality of transistor devices assembled upon the support substrate, and a test structure formed in a Group III nitride layer, wherein 0<x<1. The test structure includes a plurality of trenches configured to provide an optical diffraction grating when illuminated by UV light. The trenches have a parameter corresponding to a parameter of a feature of the transistor devices.

In an embodiment, a method of process control during manufacture of a Group III-nitride-based electronic component includes directing an incident light beam having multiple wavelengths at a position of a layer having a regular pattern of depressions configured to form an optical diffraction grating, wherein the layer comprises a Group III nitride, detecting a reflected beam, reflected from the position, and obtaining a spectrum of reflected intensity as a function of wavelength, the spectrum being representative of a feature of a parameter of the regular pattern of depressions of the position of the layer from which the beam is reflected, comparing the spectrum obtained from the detected beam with one or more reference spectra stored in memory, and adjusting a processing parameter responsive to a difference determined between the spectrum and the reference spectrum.

In an embodiment, a method for fabricating a semiconductor wafer includes epitaxially depositing at least one Group III nitride layer on a substrate wafer, forming a test structure in a Group III nitride layer, the test structure having a regular pattern of trenches forming an optical diffraction grating, each trench having a least one dimension corresponding to a dimension of a recess formed in a Group III nitride layer of a Group III nitride-based transistor device and determining a parameter of the test structure. The parameter of the test structure is determined by directing an incident light beam having multiple wavelengths between 190 nm and 365 nm at the test structure, detecting a reflected beam, reflected from the test structure and obtaining a spectrum of reflected intensity as a function of wavelength, the spectrum being representative of a feature of the test structure, comparing the spectrum with one or more reference spectra stored in memory, estimating at least one parameter of the test structure using the one or more reference spectra, and if the estimated parameter of the test structure is within a tolerance range, further processing the substrate, or if the estimated parameter of the test structure is outside of a tolerance range, discarding the substrate or adjusting a processing parameter.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a flow diagram of a method for evaluating a surface of a semiconductor substrate.

FIG. 2 illustrates a schematic diagram of apparatus for evaluating a surface of a semiconductor substrate.

FIG. 4 illustrates a schematic top view of a semiconductor wafer.

FIG. 5 illustrates a flow diagram of a method for estimating a parameter of a semiconductor substrate.

FIG. 6 illustrates a flow diagram of a method for controlling a processing parameter during manufacture of a Group III nitride-based electronic component.

FIG. 7 illustrates a flow diagram of a method for fabricating a Group III nitride-based electronic component.

FIG. 10 illustrates a schematic sectional view of a portion of a semiconductor substrate having a Group III nitride-based transistor device and a test structure.

DETAILED DESCRIPTION

Figure 3A:
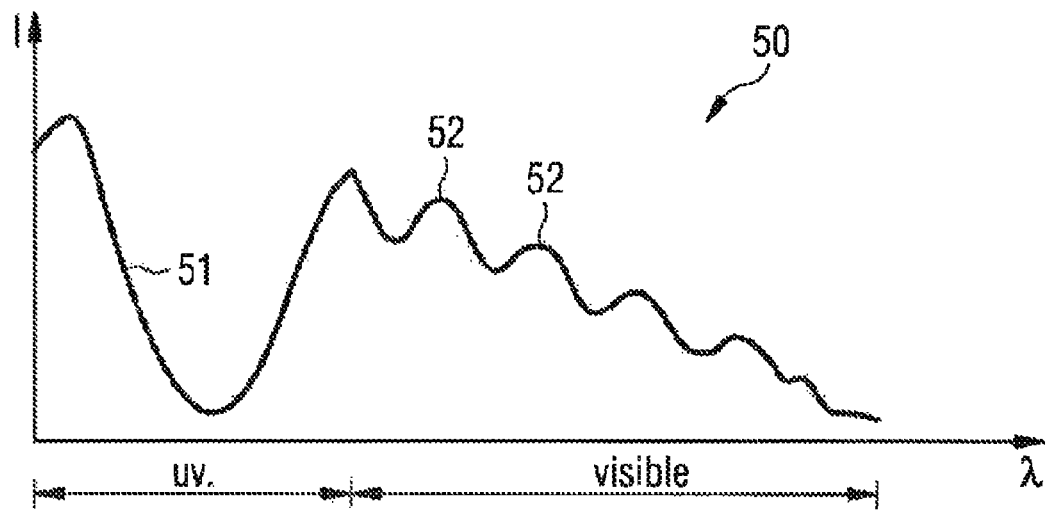
FIG. 3a illustrates a spectrum for evaluating a surface of semiconductor substrate.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly' coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where $0<x<1$.

FIG. 1 illustrates a flow diagram of a method 20 for evaluating a surface of a semiconductor substrate.

In block 21, an incident light beam having multiple wavelengths is directed at a position of a layer including a Group III nitride. The layer includes a surface profile configured to form an optical diffraction grating when illuminated by the incident light beam.

The layer may be the uppermost layer arranged on a substrate, such as a semiconductor substrate. The layer may form part of a semiconductor device being assembled on the substrate, such as a Group III nitride-based transistor device. The surface profile of the position may include a regular or periodic pattern of alternating depressions and protrusions having dimensions such that they act as an optical diffraction grating when illuminated by the incident light beam.

In block 22, a reflected beam, reflected from the position of the Group III nitride layer, is detected and a spectrum of reflected intensity as a function of wavelength is obtained. The spectrum is representative of a feature of the position of the Group III nitride layer from which the beam is reflected.

In block 23, the spectrum obtained from the detected beam is compared with one or more reference spectra stored in memory and at least one parameter of the feature is determined.

The method provides a noncontact optical method for evaluating the surface of a semiconductor substrate which may be used to indirectly infer a parameter of the feature of the Group III nitride layer illuminated by the incident beam. A scatterometry method using a broadband reflectometer with polarized light or spectral ellipsometry may be used to carry out this method. The parameter may be a dimension of the surface profile such as the depth, or width of the depressions or incline of the side walls or side wall angle of the depressions of a surface profile including a regular pattern of depressions configured to form the optical diffraction grating. The parameter may also be the pitch of the depressions, whereby the pitch describes the distance between equivalent features of immediately neighbouring depressions.

The width may be the width of a depression such as a trench at the top of the trench or the width at the bottom of the trench. The width of a feature may also be called a critical dimension. As used herein "critical" dimension is used in the metrology sense to indicate a dimension which is to be measured rather than to indicate a dimension which is of importance.

The layer including the Group III nitride may include a surface profile which is formed from Group III nitride material completely, or partially. For example, the surface profile may include a periodic pattern of trenches and mesas formed from the Group III nitride material of the layer. In another example, the surface profile may be formed of trenches and mesas, whereby the trenches have surfaces defined by Group III nitride material and the upper surface of the mesas includes a different material, such as a layer of resist material.

The wavelengths of the incident light beam may be selected such that they are diffracted from the surface profile. The Group III nitride forming the surface profile may be optically opaque at these wavelengths. Wavelengths in the UV part of the electromagnetic spectrum may be used for the purposes of measuring a dimension of the surface profile, such as the depth of the trenches forming the optical diffraction grating.

The wavelength range over which the Group III nitride is optically opaque may depend on its composition, for example the aluminium content, x, in aluminium gallium nitride, $Al_xGa_{(1-x)}N$. As the aluminium content x increases from 0 to 0.25, the absorption edge and associated band gap energy decrease from 365 nm to 320 nm. Below the absorption edge, aluminium gallium nitride is opaque.

The layer comprising a Group III nitride may form a layer of a semiconductor device such as a Group III nitride-based transistor device, for example a High Electron Mobility Transistor (HEMT). The feature evaluated using the method may be used to obtain information about a feature of the semiconductor device such as the depth of a top layer recess, such as an aluminium gallium nitride barrier recess, recess or the profile of a top layer recess or the height of a mesa structure such as a p-doped Group III nitride layer arranged between the gate and barrier layer of a HEMT.

The reference spectra may be obtained by calculating the spectrum expected to be obtained for one or more features present at the substrate position. For example, for a position having a surface profile including a regular pattern of depressions, a reference spectrum may be calculated for depressions having a predetermined depth, width and pitch or spacing. A plurality of reference spectra may be calculated, each for depressions having a different value of a parameter, for example different depths. By comparing the detected spectrum with one or more of the reference spectra, a best fit reference spectrum may be identified. The depth of the depression in the evaluated position is inferred from the depth of the depression used to calculate the reference spectra.

In some embodiments, two best fit reference spectra are identified which span the detected spectrum, for example one above and the other below the detected spectrum. The depth of the depression in the evaluated position may be inferred by interpolation between the depths of the depressions used to calculate the two best fit spectra.

An optical process control method is provided for Group III nitrides, in particular epitaxial Group III nitride layers grown on a substrate, such as a single crystal wafer. The method is used to estimate one or more parameters of a pattern forming an optical diffraction grating by measuring the optical response of the pattern. Direct extraction of the parameter of interest may be impractical if the optical response of the pattern is complex. A mathematical model may be constructed for the pattern having the parameters of interest as variables and a modelled response or reference spectrum calculated by adjusting the parameters within the range of interest.

One such mathematical model which may be used to model the optical response of a periodic structure, such as an optical diffraction grating, is Rigorous Coupled Wave Analysis (RCWA). Other less rigorous methods such as a scalar model may be used, particularly for feature sizes substantially greater than the optical wavelength.

The incident and reflected beams may travel along substantially non-overlapping paths. The incident angle, that is the angle between the incident beam and the surface of the substrate, and the reflected angle, that is the angle between the reflected beam and the surface of the substrate, may be fixed. The light source may be a broadband light source which is capable of producing a light beam having wavelengths over a range to which the layer including Group III nitride is optically opaque. As the layer is optically opaque, the incident beam is reflected from the surface and includes information about the surface profile. For an aluminium gallium nitride layer ($Al_xGa_{1-x}N$, whereby $0<x<1$), the range of wavelengths may lie in the Ultra Violet (UV) part of the electromagnetic spectrum, for example in the range of 190 nm to 365 nm.

FIG. 2 illustrates a schematic diagram of apparatus 30 for evaluating a surface 31 of a semiconductor substrate 32, such as the surface 31 of a layer 33 including aluminium gallium nitride ($Al_xGa_{1-x}N$, whereby $0<x<1$) arranged on the substrate 32.

The apparatus 30 includes a source of illumination 34 which may be a broadband light source capable of emitting light in the ultraviolet range and, optionally, also in the visible range. The apparatus 30 may also include a polarizer 35 which may be inserted into an incident light beam 36 emitted from the light source 34. The polarizer 35 may also be controllable so as to produce a polarized incident light beam 37 having two differing polarisations, such as S polarization (or transverse electric polarization (TE)) and P polarization (transverse magnetic polarization (TM)). The incident beam 36 is reflected from the surface 31 of the substrate 32 producing a reflected beam 40 which is detected by a detector 38. The reflected beam 40 travels along a path which is substantially separate and non-overlapping with the incident beam 36. An analyser 39 may be placed in the path of the reflected beam 40 before the detector 38.

The detector 38 may be coupled to a computer system 41 which may include a module 42 for obtaining a spectrum of intensity against wavelength from the detected reflected beam 40, a library module 43 including a plurality of reference spectra stored in memory and a comparison module 44 for comparing the obtained spectrum with one or more of the reference spectra stored in the library 43 and for establishing a best fit reference spectrum. The comparison module 44 may then retrieve the value of a parameter of the surface associated with the best fit reference spectrum, such as the depth of a depression, which is then inferred to be present at the position of the surface 31 illuminated by the incident light beam 37.

The incident light source 34 may be a broadband light source and the incident angle and reflected angle may be fixed with respect to the surface 31 of the substrate 32. The detected beam 40 may be a zero order diffracted beam.

The apparatus 30 may be used to evaluate a surface 31 of a semiconductor substrate 32 which includes an epitaxial aluminium gallium nitride layer 33 ($Al_xGa_{1-x}N$, where $0<x<1$). The aluminium gallium nitride layer 33 is the uppermost layer arranged on a support substrate 48 of the semiconductor substrate 32 and provides the surface 31 which is to be evaluated. One or, typically, several further epitaxial Group III nitride layers may be arranged between the semiconductor substrate 32 and the aluminium gallium nitride layer 33 as is indicated schematically by region 47. For example, the region 47 may include a buffer structure including epitaxial Group III nitride layers which are epitaxially deposited on the substrate 32 and an epitaxial gallium nitride layer deposited on the buffer structure.

The surface 31 is illuminated by the incident beam 37. The incident beam 37 has multiple wavelengths in the ultraviolet range which cannot penetrate the aluminium gallium nitride layer. The incident beam 37 is reflected from the surface 31 and produces a diffraction spectrum characteristic of at least one feature of the surface profile of the surface 31.

The surface 31 may include a regular or periodic pattern of depressions, such as trenches 45 which each have a depth d and the width w. The trenches 45 may be arranged substantially parallel to one another such that there is a regular pitch p. The pitch describes the distance from one trench to the next trench and, therefore, the distance between equivalent features of immediately neighbouring trenches 45. The trenches 45 may be considered to be spaced apart by mesas 46. The trenches 45 are configured to provide an optical diffraction grating at the wavelengths of the incident beam 36. For a layer including $Al_xGa_{1-x}N$, whereby $0<x<1$, at least ten trenches 45 may be provided. The depth d may lie in the range of 50 nm to 2000 nm, the width w in the range of 0.5 μm to 1 μm and the pitch p in the range of 1 μm to 2 μm. The pitch p may be twice the width w.

The regular pattern of depressions may be provided by a feature of an electronic component which is being assembled and built up on the substrate 32. The regular pattern of depressions may also be provided by a test structure which does not form part of the finished electronic component. The test structure provides an indirect method for measuring a parameter of the transistor device.

For example, at least one of the depth, width and pitch of the depressions may be selected to correspond to a dimension of a feature within the electronic component, which is being assembled, which it is desired to measure. In some embodiments, the pitch is kept constant and the width may be varied. For example, the depth of the trenches 45 in a test structure may correspond to the depth of a top layer recess, such as an aluminium gallium nitride barrier recess, or the height of a mesa, such as a p-GaN layer positioned between a gate and a barrier layer, used in the fabrication of a transistor device on the substrate 32. The trenches 45 of the test structure may be formed using the same process and at the same time as the top layer recess or mesa so that the profile of the trenches reflects the effects of processing conditions used to form the top layer recess or mesa.

The surface 31 may be formed from the Group III nitride material exclusively or partially by a further material. For example, the trenches 45 may have surfaces defined by the Group III nitride material and a different material is arranged on the upper surface of the mesas 46. This different material may be a hard mask, such as silicon dioxide or a soft mask such as a photoresist.

FIG. 3a illustrates a graph 50 which may be obtained using the apparatus 30 of FIG. 2 for evaluating the surface 31 of the semiconductor substrate 32. The graph 50 includes a spectrum. 51 of intensity, I, of the reflected beam 40 as a function of the wavelengths, $\lambda$, of the incident beam 36. The range of the wavelengths for which the intensity is obtained in FIG. 3a ranges over the UV and visible portions of the electromagnetic spectrum and may range from around 190 nm to 750 nanometers, for example. The spectrum 51 illustrated in FIG. 3a is representative of that obtained from an aluminium gallium nitride layer 33 having a test structure including a plurality of trenches 45, as illustrated in FIG. 2, which are configured to provide an optical diffraction grating. The epitaxial aluminium gallium nitride layer 33 is transparent to visible light. The spectrum 51 includes a number of interference oscillations 52 above wavelengths of around 360 nm which are produced by reflections from one or more underlying layers 47 on the substrate 32 since the aluminium gallium nitride layer 33 is transparent to wavelengths in this range. The support substrate 48 may be a silicon single crystal wafer and may be optically opaque to visible light. Consequently, for the purposes of evaluating the surface 31 of the aluminium gallium nitride layer 33, wavelengths in the UV part of the spectrum may be used. The maximum value of the range of suitable wavelengths depends on the aluminium content of the aluminium gallium nitride layer to be evaluated. For aluminium gallium nitride, $Al_xGa_{(1-x)}N$, having an aluminium content in the range of $0.15 \leq x \leq 0.25$, wavelengths from around 190 nm to 365 nm may be used.

Figure 3B:
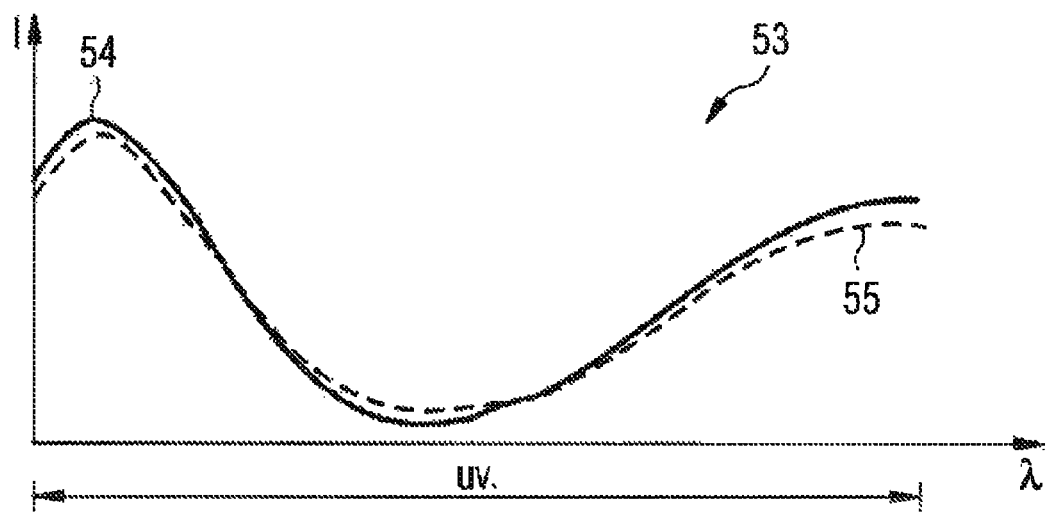
FIG. 3b illustrates a measured spectrum and a reference spectrum for evaluating a surface of semiconductor substrate.

FIG. 3b illustrates a graph 53 of intensity, I, of the reflected beam 40 measured at different wavelengths, $\lambda$, in the UV range and illustrates a spectrum 54 obtained from a Group III nitride layer and, in particular, from a position of the Group III nitride layer having a regular pattern of depressions forming an optical diffraction grating. FIG. 3b also illustrates an example of a reference spectrum 55 which is denoted with a dashed line. The reference spectrum 55 is obtained by simulation of the spectrum expected for a Group III nitride layer of the same composition having a regular pattern of depressions having a similar profile, that is a similar width, depth and pitch.

The surface 31 of the Group III nitride layer 33 is evaluated by comparing the measured spectrum 54 with one or more reference spectra 55 obtained from a library of reference spectra stored in memory, for example in library module 43. The best fit reference spectrum is determined and it is inferred from this best fit reference spectrum that the position of the sample from which the measured spectrum 55 was obtained includes a regular pattern of depressions having at least one parameter, such as the depth, which corresponds to this parameter of the best fit reference spectrum.

The comparison between the measured spectrum and one or more reference spectra may be performed for a polarized incident light 37 having a single polarisation. However, some embodiments, the polarisation of the incident light beam 36 may be changed and an incident beam with a second polarization, which is different from the first polarization, is directed at the same position of the substrate to obtain a second measured spectrum. The second measured spectrum is then also compared with one or more of the reference spectra of the library and the results of both of the best fit reference spectra are used to infer information about a parameter of the surface at the position of Group III nitride layer from which the two measured spectra were obtained.

In some embodiments, the feature of the electronic component to be evaluated cannot be directly measured using scatterometry techniques since the feature itself does not have a profile suitable for producing an optical diffraction grating. For example, when building up a transistor device structure, each component position includes a single a top layer recess, such as an aluminium gallium nitride barrier recess, in which the gate may be arranged. The spacing between the top layer recesses of immediately adjacent component positions may be too large to provide an optical diffraction grating and, therefore, scattering effects suitable for evaluation using scatterometry techniques. In these embodiments, one or more test structures may be formed on the substrate using the same processing conditions as that used to form the gate recess so that at least one dimension of the test structure corresponds to the dimension of the top layer recess it is designed to measure. For example, the depth of the trenches of the test structure may correspond to the depth of an aluminium gallium nitride barrier recess or the height of a mesa, such as a p-doped GaN layer or a p-doped AlGaN layer.

In embodiments, in which the regular pattern of depressions forming the optical diffraction grating is provided by a test structure, the parameter inferred from the measured spectrum or spectra obtained from the test structure is inferred to represent the same parameter of the feature of the electronic component which it is desired to investigate, such as the depth of the aluminium gallium nitride barrier recess.

The test structure may be formed at various positions in the test semiconductor substrate.

FIG. 4 illustrates a schematic top view of a wafer 60 having a plurality of component positions 61 bounded by saw streets 62 arranged in orthogonal rows and columns and indicated with dashed lines. A test structure 63 may include a plurality of depressions or trenches 64 which extend substantially parallel to one another each having a depth and width and spaced apart by a pitch to provide an optical diffraction grating at the wavelengths to which the material of the test structure is optically opaque.

For a wafer 60 supporting the assembly of Group III nitride based devices such as a Group III nitride-based HEMT, the wafer 60 includes a surface capable of supporting the epitaxial growth of a Group III-nitride. The wafer 60 may be a silicon wafer, such as a <111> silicon wafer, a <110> silicon wafer, or a silicon carbide wafer or a sapphire wafer.

One or more epitaxial Group III nitride layers are arranged on the surface of the wafer 60 form part of a plurality of transistor devices being assembled upon the wafer 60. In some embodiments, at least one test structure 63 is formed in an $Al_xGa_{1-x}N$ layer of the transistor devices, wherein 0<x<1. The test structure 63 may be arranged in a portion of one of the transistor devices, in a dummy device position or an a saw street.

The test structure 63 includes a plurality of trenches 64 configured to provide a diffraction grating when illuminated by UV light. If the depth of the aluminium gallium nitride (AlGaN) barrier recess of the transistor devices is to be determined, each of the trenches 64 is provided with a depth corresponding to the depth of an aluminium gallium nitride barrier recess. The depth may lie the range of 30 nm to 2000 nm, 50 nm to 1000 nm, or 50 nm to 200 nm, for example. The width may lie in the range of 300 nm to 1500 nm, or 0.5 μm to 1 μm and the pitch may lie in the range of 600 nm to 3000 nm, or 1 μm to 2 μm, for example. The pitch may be substantially twice the width.

The test structure 63 may include at least 10 trenches and have an area which is greater than the area of the incident beam, for example overall lateral dimensions of 60 μm to 60 μm. In another example, if the incident beam has a diameter of 50 μm, the regular pattern may have an area of at least 1900 μm$^2$. In some embodiments, the incident light beam has a diameter which is at least ten times greater than the pitch.

The test structure 63 may be arranged in a saw street 62 and be removed during singulation of the wafer to produce the individual semiconductor components. However, in some embodiments, the test structure 63' may be positioned in a portion of electronic component position 65 such that it is present in the finished electronic component. The test structure 63' may be positioned in an inactive portion of the component position 65, such as at the peripheral edge or may be arranged within the active region of the semiconductor device but at a position in which it does not affect the functionality of the semiconductor device. The test structure 63" may be arranged in a test chip or dummy component position which undergoes the same processing methods as the devices.

Whilst the semiconductor wafer may be provided with a single test structure 63, in some embodiments, two or more test structures 63 are provided which are arranged at differing positions across the wafer 60. For example, in the case of a wafer 60 having a 200 mm diameter, around thirty test structures may be positioned at intervals across the wafer of which around ten may be evaluated for a particular wafer. In these embodiments, each of the test structures 63 may be evaluated by imparting relative motion between the wafer and the light source and directing the incident beam at a further test structure whilst the relative motion is substantially zero.

Information regarding the uniformity of the process may be obtained by comparing the results obtained for a particular parameter at each position. For example, in embodiments in which the test structure 63 is formed by the etch process forming the aluminium gallium nitride (AlGaN) barrier recess in a HEMT, by measuring several test structures positioned at intervals over the surface of the wafer 60, information about the uniformity of the plasma etch process and the uniformity of the depth of the aluminium gallium nitride barrier recess of the HEMTs across the area of the wafer 60 may be obtained.

FIG. 5 illustrates a flow diagram of a method 70 for estimating a parameter of a feature of a semiconductor substrate.

In block 71, an incident light beam having multiple wavelengths is directed at a position of a Group III nitride layer having a regular pattern of depressions configured to form an optical diffraction grating. The incident beam may include multiple wavelengths in the UV portion of the electromagnetic spectrum, for example between 190 nm and 365 nm.

In block 72, a reflected beam, reflected from the substrate position, is detected and a spectrum of reflected intensity as a function of wavelength is obtained. The spectrum is representative of at least one feature of the position from which the beam is reflected.

In block 73, the spectrum provided by the detected beam is compared with one or more reference spectra of a library of reference spectra stored in memory and a best fit with one of the reference spectra in the library is determined.

In block 74, at least one parameter of the regular pattern of depressions is estimated using the best fit reference spectrum.

In decision diamond 75, it is determined if the estimated parameter of the depressions is within a tolerance range. If the parameter of the depressions is outside of the tolerance range, the method proceeds to block 76 and the substrate is discarded. If the estimated parameter of the depressions is within the tolerance range, the method proceeds to block 77 and the substrate is further processed.

The reference spectra in the library are calculated for a range of depths and a range of widths having a predetermined discretisation or step size. The discretisation or step size is selected such that it is sufficiently small to enable a best fit reference pattern to be determined from the library of reference spectra.

FIG. 6 illustrates a flow diagram 80 of a method for controlling a processing parameter during manufacture of a Group III nitride-based electronic component, in particular a Group III nitride-based HEMT. For example, one or more processing parameters of an etch process, such as a plasma etch process, used to form an aluminium gallium nitride barrier recess of a Group III nitride-based HEMT may be controlled using the method 80. In another example, one or more processing parameters of an etch process, such as a plasma etch process, used to form p-doped Group III nitride mesa from a p-doped Group III nitride layer for a gate structure of a Group III nitride-based HEMT may be controlled using the method 80.

In block 81, an incident light beam having multiple wavelengths is directed at a position of a Group III nitride layer having a regular pattern of depressions configured to form an optical diffraction grating. The depressions are formed during the process to form a recess in a Group III nitride layer, in particular a AlGaN barrier layer of a HEMT or a p-doped Group III nitride layer of a HEMT. The incident beam may include multiple wavelengths in the UV portion of the electromagnetic spectrum, for example between 190 and 365 nm.

In block 82, a reflected beam, reflected from the substrate position, is detected and a spectrum of reflected intensity as a function of wavelength is obtained. The spectrum is representative of the depth of the depressions.

In block 83, the spectrum obtained from the detected beam is compared with one or more reference spectra of a library of reference spectra stored in memory and a best fit with one of the reference spectra in the library is determined.

In block 84, at least one parameter, in particular the depth, of the regular pattern of depressions in the Group III nitride layer is estimated using the best fit reference spectrum. The parameter of a feature of a device being assembled in a further, non-evaluated, portion of the Group III nitride layer may be inferred from the parameter of the feature at the evaluated position, which is estimated using the best fit reference spectrum.

In decision diamond 85, it is determined if the estimated parameter of the depressions is within a tolerance range. If the parameter of the depressions is outside of the tolerance range, the method proceeds to block 86 and at least one process parameter is adjusted responsive to the difference determined between the detected spectrum and the reference spectrum. In some embodiments, the at least one process parameter is adjusted to compensate for the difference between the measured parameter and the target value of the parameter. If the estimated parameter of the depressions is within the tolerance range, the method proceeds to block 87 and the substrate is further processed, for example, a gate insulation layer and/or passivation and metallization layers may be deposited to complete the HEMT structure.

FIG. 7 illustrates a flow diagram of a method 90 for fabricating a Group III nitride-based HEMT.

In block 91, at least one Group III nitride layer is epitaxially deposited onto a substrate wafer. In block 92, a test structure is formed in a Group III nitride layer. The test structure has a regular pattern of substantially parallel trenches forming an optical diffraction grating. Each trench has a least one dimension corresponding to a dimension of a structure of a Group III nitride-based electronic component. For example, the depth of each trench may correspond to the depth of an aluminium gallium nitride (AlGaN) barrier recess of the HEMT or the height of a p-doped Group III nitride mesa arranged between the gate and barrier layer of the HEMT.

A parameter of the test structure, such as the depth of the trenches, is determined by scatterometry techniques, for example, by, in block 93, directing an incident light beam having multiple wavelengths between 190 nm and 365 nm at the test structure, in block 94, detecting a reflected beam, reflected from the test structure and obtaining a spectrum of reflected intensity as a function of wavelength, the spectrum being representative of a feature of the test structure, in block 95, comparing the spectrum provided by the detected beam with one or more reference spectra stored in memory, and in block 96 estimating at least one parameter of the test structure using the one or more reference spectra.

The test structure may be formed in the Group III nitride layer by etching, for example plasma etching. The surface of the Group III nitride layer may be etched to form a recess, such as an aluminium gallium nitride (AlGaN) barrier layer recess or recess defining a mesa such as a p-doped Group III nitride layer, in a component position and a test structure at a different position using the same process. A relationship between the depth of the trenches of the test structure and the depth of the recess may be established in a calibration process and this relationship used during later measurements. For example, in some embodiments, it is assumed that the depth of the trenches of the test structure is the same as the depth of the recess. Due to the known relationship between the depth of the trenches of the test structure and the depth of the recess, the depth of the recess can be inferred by determining the depth of the trenches of the test structure.

In decision diamond 97, the estimated parameter of the test structure is compared to a target value of the parameter. If the estimated parameter of the test structure is within a tolerance range of a target value, the method proceeds to block 98 and the substrate is further processed, for example to complete the HEMT structure. If the estimated parameter of the test structure is outside of the tolerance range of a target value, the substrate may be discarded and the processing left incomplete or at least one processing parameter may be adjusted for at least one subsequently processed wafer or at least one subsequently processed batch of wafers.

Figure 8:
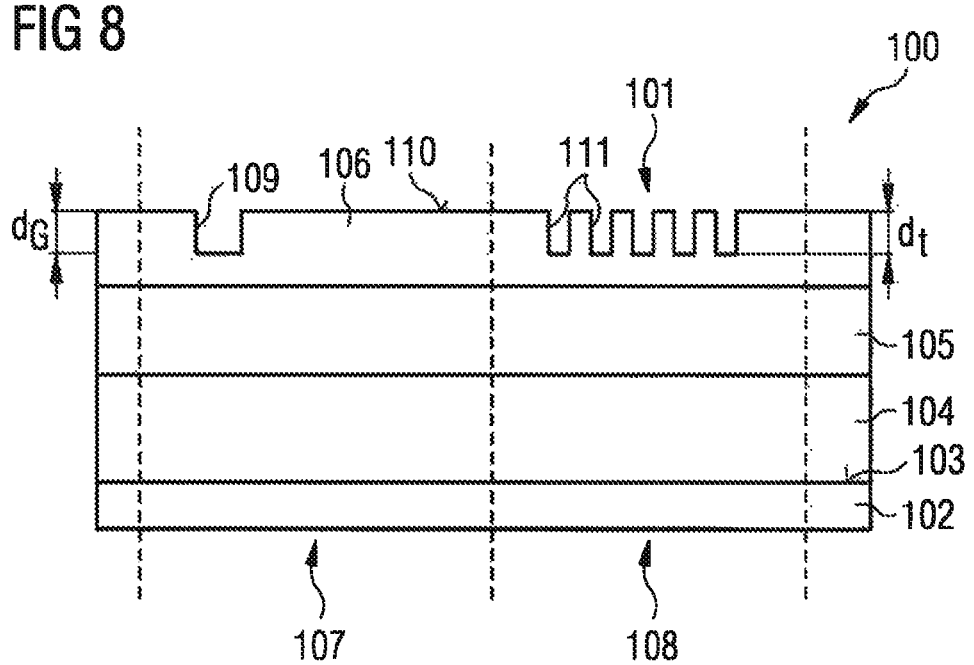
FIG. 8 illustrates a schematic sectional view of a portion of a semiconductor substrate having a test structure.

FIG. 8 illustrates a schematic cross-sectional view of a portion of a semiconductor substrate 100 having a test structure 101 which may be evaluated using a method according to one or more of the embodiments described herein.

The semiconductor substrate 100 includes a semiconductor wafer 102 including a surface 103 capable of supporting the epitaxial growth of Group III nitride compounds. The semiconductor wafer 102 may be a silicon wafer, such as a <111> silicon wafer, a <110> silicon wafer, a silicon carbide wafer or a sapphire wafer. The semiconductor substrate 100 includes a Group III nitride buffer structure 104 epitaxially grown on the surface 103 of the semiconductor wafer 102, a channel layer 105 including gallium nitride (GaN) epitaxially grown on the buffer layer 104 and a barrier layer 106 including aluminium gallium nitride (AlGaN or $Al_xGa_{1-x}N$ where $0<x<1$) which is epitaxially grown on the channel layer 105. FIG. 8 illustrates a component position 107, in which a High Electron Mobility Transistor (HEMT) is being built up, and a saw street 108, in which the test structure 101 is formed. In other embodiments, the test structure 101 may be formed in a portion of one of the component positions forming a transistor device or in a test device position.

A recess 109 having a depth $d_G$ is formed in the surface 110 of the aluminium gallium nitride layer barrier layer 106 in the component position 107. The recess 109 may be formed by etching and in some embodiments, by plasma etching. The process, which is used to form the recess 109, is also used to form the test structure 101 in the saw street 108. The test structure 101 has a plurality of depressions in the surface 110 of the barrier layer 106 which have the form of elongate trenches 111 which extend substantially parallel to one another. Each of the trenches 111 includes depth $d_t$ which is substantially the same as the depth $d_G$ of the recess 109 in the component position 107. The trenches 111 also have a width $w_t$ and a pitch $p_t$ such that test structure 101 provides an optical diffraction grating when illuminated by UV light.

Once it has been established that the depth $d_t$ of the trenches 111 of the test structure 101 is within an accepted tolerance range and by inference, that the depth $d_G$ of the recess 109 lies within an acceptable tolerance range, the semiconductor wafer 100 is further processed to complete the HEMT.

Figure 9:
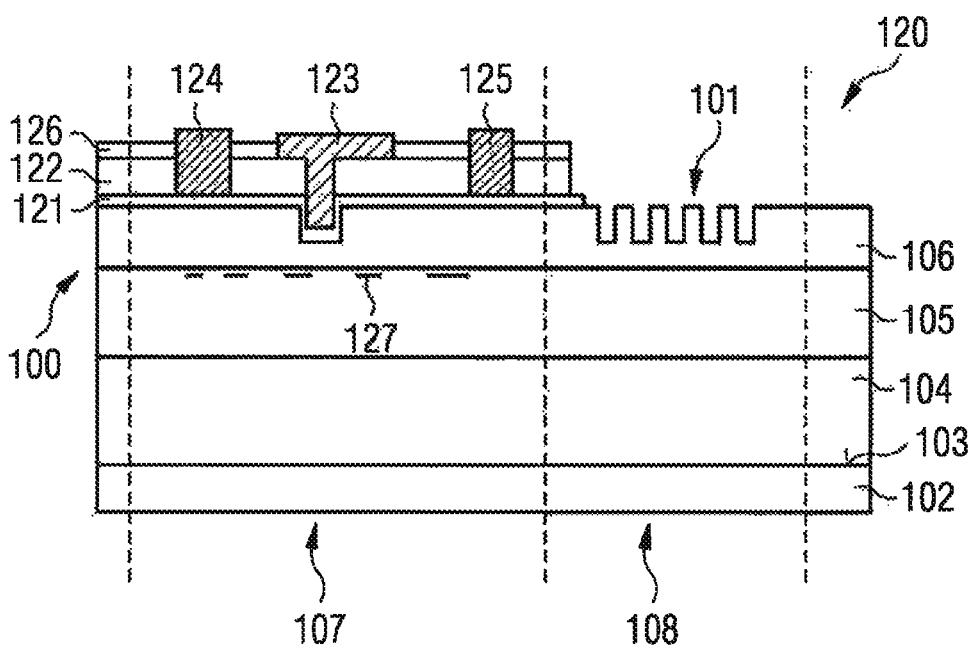
FIG. 9 illustrates a schematic sectional view of a portion of a semiconductor substrate having a Group III nitride-based transistor device and a test structure.

FIG. 9 illustrates a schematic cross-sectional view of a portion of the semiconductor substrate 100 after further processing to form the HEMT 120.

A GaN cap layer 121 may be deposited onto the surface 110 of the barrier layer 106. The GaN cap layer 121 lines the recess 109. A silicon nitride layer passivation layer 122 may be deposited on the GaN cap layer 121. Apertures may be formed in the silicon nitride passivation layer 121 for the gate contact 123, the source contact 124 and the drain contact 125. The source contact 124 and the drain contact 125 may form an ohmic contact to the GaN cap layer 121. The gate contact 123 is arranged in the recess 109 may have a T-shape. One or more further passivation layers 126 may also be provided which extend on the silicon nitride passivation layer 122 between the metal contacts. A two-dimensional charge gas such as a two-dimensional electron gas (2DEG) or two-dimensional hole gas (2DHG) may be formed by piezoelectric and spontaneous polarization at the interface between the channel layer 105 and the barrier layer 106 as is indicated by the dashed line 127.

The further processing steps to complete the HEMT structure may be carried out for the entire wafer such that the test structure 101 is covered by additional layers such as the GaN cap layer 121, silicon nitride layer 122 and metal layers or layers to form the contacts 123, 124, 125. In embodiments in which the test structure 101 is positioned in the saw street 108 and has served its purpose, further attention need not be paid to the portions of the semiconductor substrate including the test structures 101.

FIG. 10 illustrates a schematic sectional view of a portion of a semiconductor substrate 130 having a Group III nitride-based transistor device in the form of an enhancement mode HEMT 131 and a test structure 132.

The HEMT 131 may include a Group III nitride channel layer 133 including GaN, a Group III nitride barrier layer 134 including aluminium gallium nitride ($Al_xGa_{1-x}N$ where $0<x<1$) arranged on the channel layer 133, a source 135 and a drain 136 arranged on the Group III nitride barrier layer 134. In this embodiment, a further p-doped Group III nitride layer 137 is arranged between the gate 138 and the Group III nitride barrier layer 134. The p-doped Group III nitride layer 137 may include magnesium-doped GaN. In the structure of the HEMT 131, the p-doped Group III nitride layer 137 has a defined lateral extent and height and may be called a mesa 139.

The p-doped Group III nitride mesa 139 under the gate 138 of the HEMT 131 may be formed by etching a continuous p-doped Group III nitride layer deposited onto the Group III nitride barrier layer 134. The uppermost surface of the barrier layer 134 may also be removed from regions adjacent the mesa 139 during this etching process. The height of the mesa 139 may be measured using the test structure 132.

The test structure 132 may include a plurality of trenches 140 or depressions which are formed in the continuous p-doped Group III nitride layer using the etching conditions used to form the p-doped Group III nitride mesa 139 of the HEMT 131. The trenches 140 or depressions may extend through the thickness of the p-doped Group III nitride layer and may define mesas 141 of the p-doped Group III nitride layer. The trenches 140 and mesas 141 form an optical diffraction grating when illuminated by UV light. The depth of the trenches 140 of the test structure 132 and consequently the height of the mesas 141 of the test structure 132 corresponds to the height of the p-doped Group III-nitride layer 137 providing the mesa 139 structure of the HEMT 131.

A two-dimensional charge gas such as a two-dimensional electron gas (2DEG) may be formed by piezoelectric and spontaneous polarization at the interface between the channel layer 133 and the barrier layer 134 as is indicated by the dashed line 142.

FIGS. 9 and 10 illustrate examples of a structure of a HEMT 120 which may be fabricated using the evaluation methods described herein. The evaluation methods may be used in fabrication of HEMTs having differing structures, for example differing buffer structures, differing gate structures, additional Group II nitride layer including a spacer layer and a back barrier layer, for example. The HEMT may be a depletion-mode device or an enhancement mode device and may be a high-voltage device, for example have a blocking voltage capability of at least 600V. The methods are not limited to the evaluation of a top layer, such as a p-GaN mesa or a barrier recess formed in a barrier layer such as an aluminium gallium nitride barrier layer of the HEMT and may also be used to evaluate other features during processing or after processing of the HEMT device, such as accuracy of the masking and overlay structures used to fabricate a multi-layer metallization structure for the gate, source and drain.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor structure, comprising:
a support substrate comprising a surface adapted to support epitaxial growth of a Group III nitride;
one or more epitaxial Group III nitride layers arranged on the surface and supporting a plurality of transistor devices assembled upon the support substrate; and
a test structure formed in a Group III nitride layer, the test structure comprising a plurality of trenches configured to provide an optical diffraction grating when illuminated by UV light, the trenches having a parameter corresponding to a parameter of a feature of the transistor devices.

2. The semiconductor structure of claim 1, wherein the test structure is arranged in a portion of one of a transistor device, a test device and a saw street.

3. The semiconductor structure of claim 1, wherein the support substrate comprises one of <111> Si, <110> silicon, SiC and sapphire, wherein the semiconductor structure further comprises a buffer structure arranged on the surface of the support structure and a gallium nitride layer arranged on the buffer structure, and wherein the Group III nitride layer including the test structure includes a barrier $Al_xGa_{1-x}N$ layer arranged on the gallium nitride layer.

4. The semiconductor structure of claim 1, wherein the parameter is depth and the depth corresponds to a depth of a barrier recess of the transistor devices.

5. The semiconductor structure of claim 1, wherein the parameter is depth, wherein the Group III nitride layer including the test structure includes a p-doped Group III nitride layer arranged on a $Al_xGa_{1-x}N$ barrier layer, and wherein the depth corresponds to a height of a mesa including p-doped Group III nitride of the transistor devices.

* * * * *